(12) United States Patent
He et al.

(10) Patent No.: US 11,678,464 B2
(45) Date of Patent: Jun. 13, 2023

(54) HEAT TRANSFER DEVICE FOR USE IN AN INFORMATION HANDLING SYSTEM

(71) Applicant: Dell Products L.P., Round Rock, TX (US)

(72) Inventors: Qinghong He, Austin, TX (US); John Trevor Morrison, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 98 days.

(21) Appl. No.: 17/444,582

(22) Filed: Aug. 6, 2021

(65) Prior Publication Data

US 2023/0041122 A1    Feb. 9, 2023

(51) Int. Cl.
*H05K 7/20* (2006.01)

(52) U.S. Cl.
CPC .............................. *H05K 7/20336* (2013.01)

(58) Field of Classification Search
CPC ................................................. H05K 7/20336
See application file for complete search history.

(56) References Cited

U.S. PATENT DOCUMENTS

| 4,058,160 A * | 11/1977 | Corman ................ F28D 15/046 165/104.26 |
| 6,938,680 B2 * | 9/2005 | Garner ................. H01L 23/427 165/80.4 |
| 7,234,513 B2 * | 6/2007 | Wong .................... F28D 15/046 165/104.33 |
| 10,602,638 B2 | 3/2020 | North et al. |
| 2006/0113065 A1 * | 6/2006 | Wolford .................... F28F 1/16 257/E23.088 |
| 2021/0289669 A1 * | 9/2021 | Yurchenko .............. F28D 15/04 |

* cited by examiner

*Primary Examiner* — Mukundbhai G Patel
(74) *Attorney, Agent, or Firm* — McDermott Will & Emery LLP (57) ABSTRACT

A heat transfer device, including a sealed container defining an internal chamber having a first internal surface positioned opposite to a second internal surface, the sealed container including a first end and a second end positioned opposite to the first end; internal fins extending from the first internal surface of the internal chamber towards the second internal surface of the internal chamber, the internal fins positioned at the second end of the sealed container; a wicking structure positioned along the internal surfaces, and positioned between adjacent fins along the first internal surface such that the internal fins are in thermal communication with the wicking structure; a remote heat exchanger positioned along an external surface of the sealed container at the second end of the sealed container, the remote heat exchanger adjacent to the internal fins such that the remote heat exchanger is in thermal communication with the internal fins.

16 Claims, 5 Drawing Sheets

FIG. 6

HEAT TRANSFER DEVICE FOR USE IN AN INFORMATION HANDLING SYSTEM

BACKGROUND

Field of the Disclosure

The disclosure relates generally to an information handling system, and in particular, a heat transfer device for use in the information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In a heat pipe or vapor chamber used in an information handling system, the temperature drop/rise between hot and cold ends depends on a series of thermal resistances including at least conduction, evaporation, vapor temperature drop, and condensation.

SUMMARY

Innovative aspects of the subject matter described in this specification may be embodied in a heat transfer device, including a sealed container defining an internal chamber having a first internal surface positioned opposite to a second internal surface, the sealed container including a first end and a second end positioned opposite to the first end; a set of internal fins extending from the first internal surface of the internal chamber towards the second internal surface of the internal chamber, the set of internal fins positioned at the second end of the sealed container; a wicking structure positioned along the first and the second internal surfaces, and positioned between adjacent fins of the set of fins along the first internal surface such that the set of internal fins are in thermal communication with the wicking structure; and a remote heat exchanger positioned along an external surface of the sealed container at the second end of the sealed container, the remote heat exchanger adjacent to the set of internal fins such that the remote heat exchanger is in thermal communication with the set of internal fins.

Other embodiments of these aspects include corresponding systems and apparatus.

These and other embodiments may each optionally include one or more of the following features. For instance, the set of internal fins are configured to transfer heat to the remote heat exchanger. The set of internal fins substantially span a distance of the remote heat exchanger. The set of internal fins span approximately half of a distance of the remote heat exchanger. The set of internal fins are substantially parallel to fins of the remote heat exchanger. The set of internal fins are substantially perpendicular to fins of the remote heat exchanger. The set of internal fins are at an angle with respect to fins of the remote heat exchanger. Further including an additional set of internal fins extending from the first internal surface of the internal chamber towards the second internal surface of the internal chamber, the additional set of internal fins positioned at the first end of the sealed container.

Particular implementations of the subject matter described in this specification can be implemented so as to realize one or more of the following advantages. For example, a reduction in thermal resistance in a thermal transfer device is obtained that results in an increase in heat transfer capacity of the thermal transfer device.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This disclosure discusses a heat transfer device for use in an information handling system. In short, the information handling system can also include a heat transfer device. The heat transfer device can facilitate removing or transferring heat from one or more components of the information handling system. The heat transfer device can include internal fins to promote such heat removal.

Specifically, this disclosure discusses a heat transfer device, including: a sealed container defining an internal chamber having a first internal surface positioned opposite to a second internal surface, the sealed container including a first end and a second end positioned opposite to the first end; a set of internal fins extending from the first internal surface of the internal chamber towards the second internal surface of the internal chamber, the set of internal fins positioned at the second end of the sealed container; a wicking structure positioned along the first and the second internal walls, and positioned between adjacent fins of the set of fins along the first internal surface such that the set of internal fins are in thermal communication with the wicking structure; and a remote heat exchanger positioned along an external surface of the sealed container at the second end of the sealed container, the remote heat exchanger adjacent to the set of internal fins such that the remote heat exchanger is in thermal communication with the set of internal fins.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-6 wherein like numbers are used to indicate like and corresponding parts.

Figure 1:
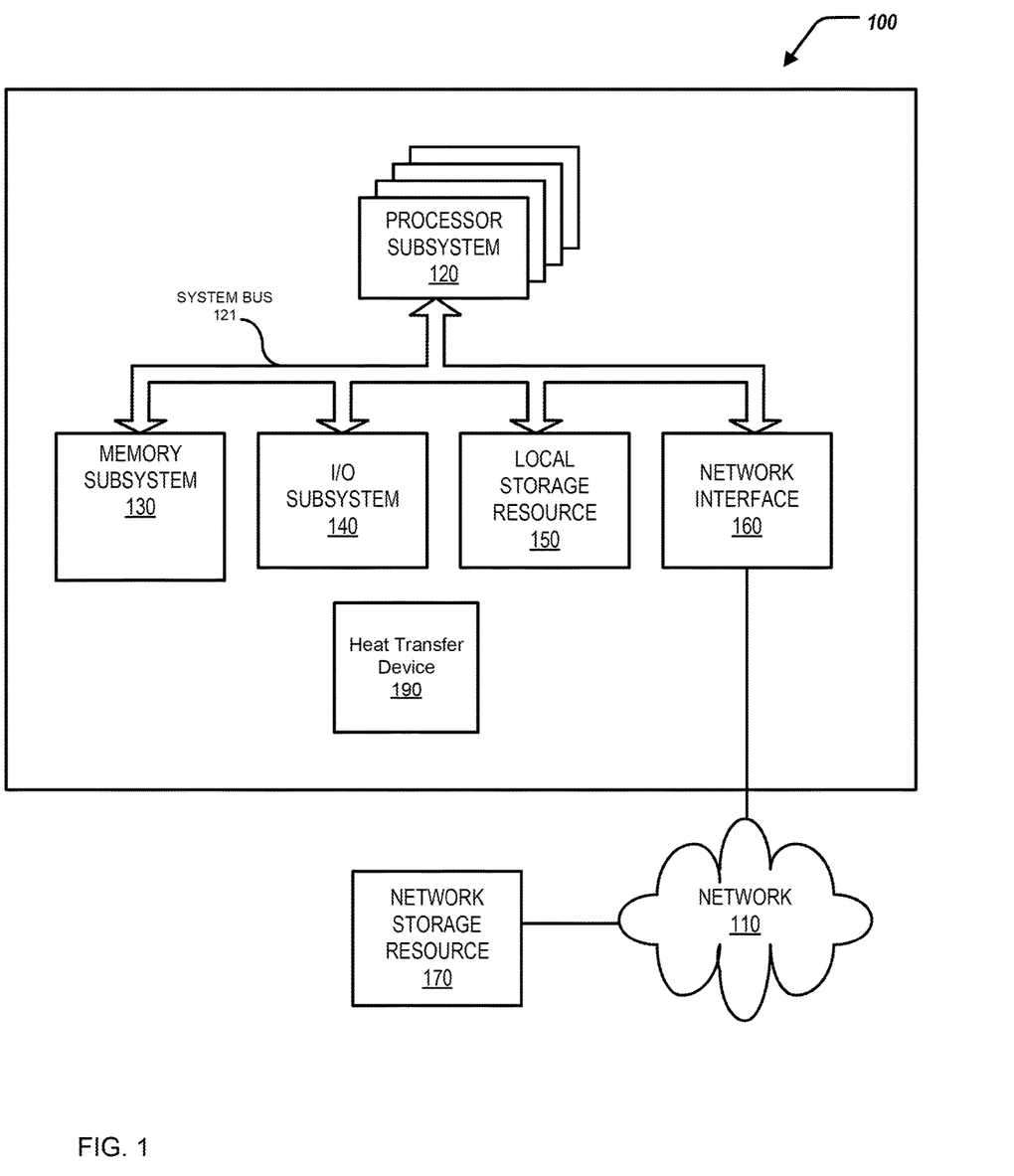
FIG. 1 is a block diagram of selected elements of an embodiment of an information handling system.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can also include a heat transfer device 190. In short, the heat transfer device 190 can facilitate removing or transferring heat from one or more components of the information handling system 100. The heat transfer device 190 can include internal fins to promote such heat removal.

Figure 2:
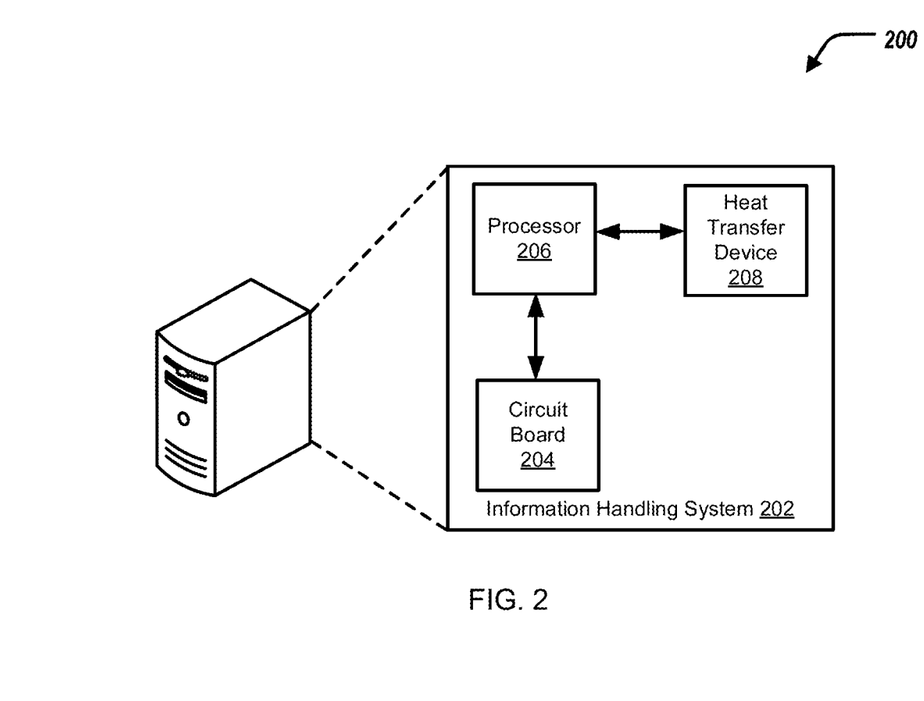
FIGS. 2, 3 illustrates a block diagram of the information handling system including a heat transfer device.

Turning to FIG. 2, FIG. 2 illustrates an environment 200 including an information handling system 202. The information handling system 202 can include a circuit board 204 (printed circuit board, a motherboard, or any type of computing card), a processor 206 (CPU, GPU, or any type of computing module), and a heat transfer device 208 (a heat pipe or a vapor chamber). In some examples, the information handling system 202 is similar to, or includes, the information handling system 100 of FIG. 1. In some examples, the heat transfer device 208 is the same, or substantially the same, as the heat transfer device 190 of FIG. 1.

The circuit board 204 can include the processor 206, or can be in communication with or coupled with the processor 206. The circuit board 204 can further be in thermal communication with the processor 206. The processor 206 can be in thermal communication with the heat transfer device 208.

Figure 3:
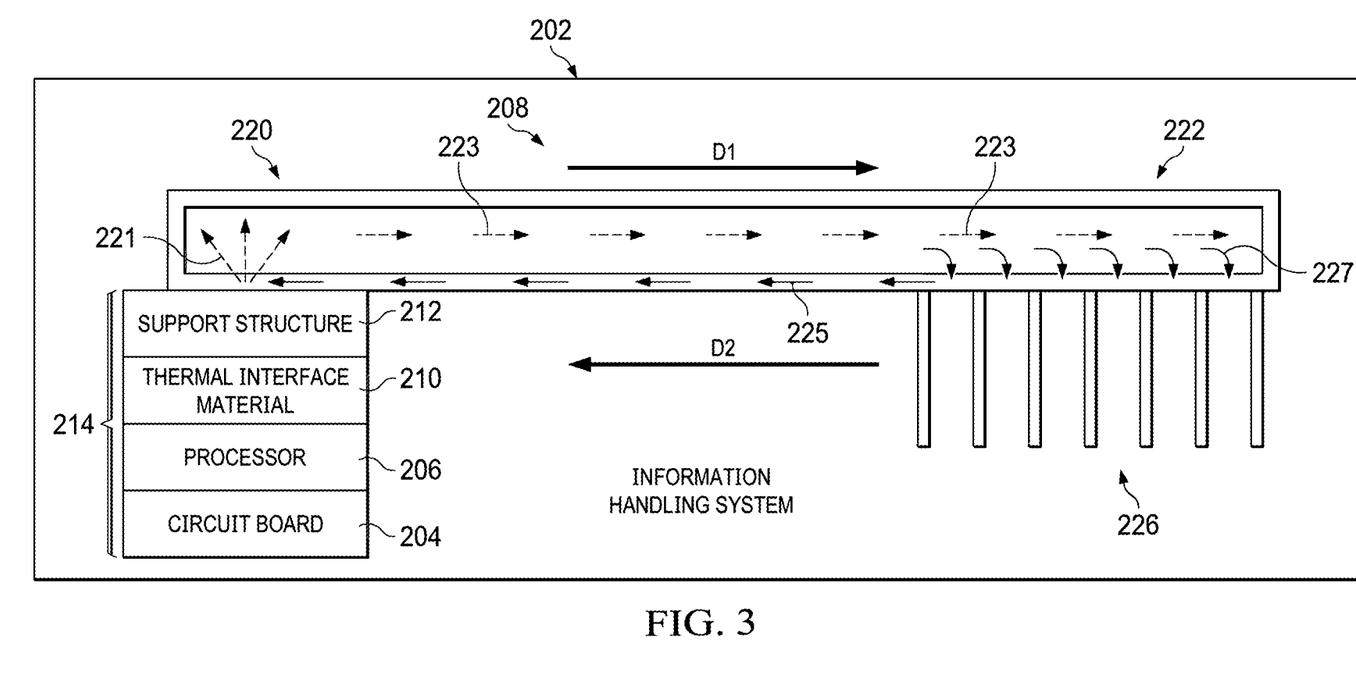

FIG. 3 illustrates a block diagram the information handling system 202, and in particular, the heat transfer device 208. Specifically, the information handling system 202 can further include a thermal interface material (TIM) 210 (such as Shin Etsn 7921 thermal grease) and a support structure 212. The circuit board 204, the processor 206, the TIM 210, and the support structure 212 can form a thermal stack 214 for thermal transfer with the heat transfer device 208, described further herein. The TIM 210 can provide thermal coupling between the processor 206 and the support structure 212. The support structure 212 can provide structural support between the thermal stack 214 and the heat transfer device 208. In some examples, the support structure 212 is formed from copper. The heat transfer device 208 can contain (or include) a working fluid within the heat transfer device 208. The working fluid can exist within the heat transfer device 208 as vapor, liquid, or both. In some examples, the working fluid can include water or ammonia.

In short, the heat transfer device 208 can facilitate transfer of heat from the thermal stack 214 (shown as arrows 221) at a first end 220 of the heat transfer device 208 towards a second end 222 of the heat transfer device 208 positioned opposite to the first end 220 (shown along direction D1 and arrows 223). The heat can transfer to a remote heat exchanger (RHE) 226 (shown as arrows 227) for egress of the heat from the thermal stack 214, described further herein. For example, the working fluid of the heat transfer device 208 can evaporate (as a gas) at the first end 220 of the heat transfer device 208 and travel towards the second end 222 of the heat transfer device 208 where the working fluid can condense into a liquid (e.g., by the RHE 226). The working fluid as a condensed fluid can be transported back to the first end 220 of the heat transfer device 208 from the second end 222 via a wicking structure of the heat transfer device 208, forming a loop process. As a result of removal of heat, cooled air/vapor can transfer from the second end 222 of the heat transfer device 208 to the first end 224 of the heat transfer device 208 (shown along direction D2 and arrows 225) to facilitate cooling of the thermal stack 214.

Figure 4:
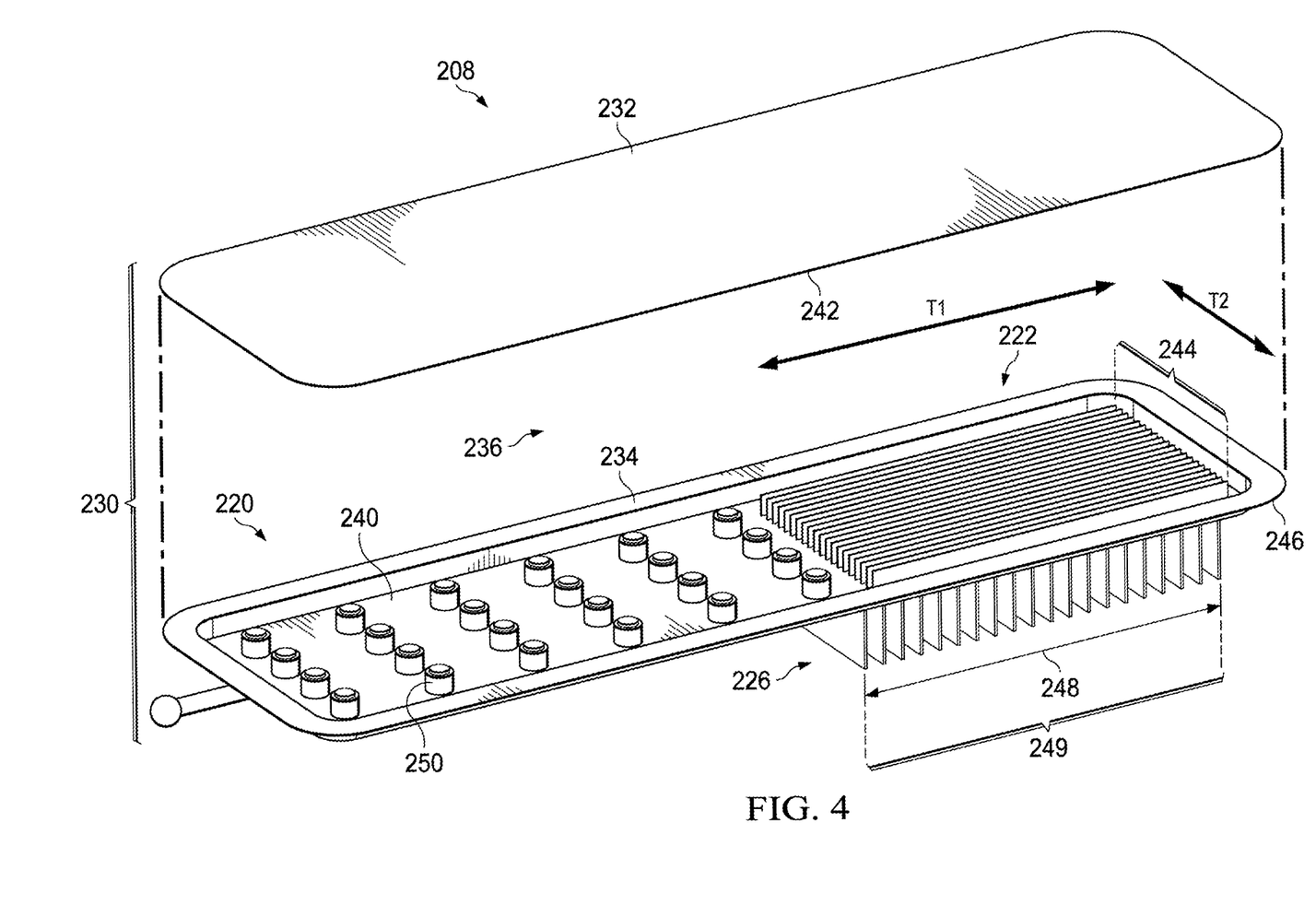
FIG. 4 illustrates a top-down exploded perspective view of the heat transfer device.

FIG. 4 illustrates a top-down exploded perspective view of the heat transfer device 208. The heat transfer device 208 can include a sealed container 230. The sealed container 230 can include a top portion 232 and a bottom portion 234 that define an internal chamber 236 therebetween when the top portion 232 is coupled to the bottom portion 234. The internal chamber 236 can include a first internal surface 240 at the bottom portion 234. The internal chamber 236 can include a second internal surface 242 at the top portion 232. The first internal surface 240 can be positioned opposite to the second internal surface 242 (when the top portion 232 is coupled to the bottom portion 234). The sealed container 230 can include the first end 220 positioned opposite to the second end 222. In some examples, the top portion 232 and the bottom portion 234 of the sealed container 230 can be formed from copper, or a copper-based material.

The heat transfer device 208 can further include a set of internal fins 244. The internal fins 244 can extend from the first internal surface 240 and towards the second internal surface 242. Furthermore, the internal fins 244 can be positioned at the second end 222 of the sealed container 230. In some examples, the internal fins 244 are soldered to the bottom portion 234, and formed from copper, or a copper-based material. The internal fins 244 can include any number of fins, e.g., 3 fins, 10 fins, 20 fins, etc.

The RHE 226 can be positioned along an external surface 246 of the sealed container 230, and in particular, of the bottom portion 234. The RHE 226 can be positioned at the second end 222 of the sealed container 230. The RHE 226 can be positioned adjacent to the internal fins 244. In other words, the RHE 226 can be positioned opposite to the internal fins 244. The RHE 226 can include fins 249. The fins 249 can include any number of fins, e.g., 3 fins, 10 fins, 20 fins, etc.

In some examples, the internal fins 244 can span a distance 248 of the RHE 226. That is, a surface area of the first internal surface 240 that is occupied by the internal fins 244 can be substantially the same as a surface area of the external surface 246 that is occupied by the RHE 226.

In some examples, the internal fins 244 span a portion of the distance 248 of the RHE 226. That is, a surface area of the first internal surface 240 that is occupied by the internal fins 244 can be less than a surface area of the external surface 246 that is occupied by the RHE 226. For example, the internal fins 244 span approximately half of the distance 248 of the RHE 226.

In some examples, the internal fins 244 are substantially perpendicular to fins 249 of the RHE 226. That is, the internal fins 244 can extend along a first direction T1, and the fins 249 of the RHE 226 can extend along a second direction T2 that is perpendicular to the first direction T1.

In some examples, the internal fins 244 are substantially parallel to the fins 249 of the RHE 226. That is, in some examples, the internal fins 244 can extend along the first direction T1, and the fins 249 of the RHE 226 can also extend along the first direction T1. In some examples, the internal fins 244 can extend along the second direction T2, and the fins 249 of the RHE 226 can also extend along the second direction T2.

In some examples, the internal fins 244 are positioned at an angle with respect to the fins 249 of the RHE 226. For example, the internal fins 244 are positioned at a 45 degree angle with respect to the fins 249 of the RHE 226.

The sealed container 230 can further include pillars 250 for structural support between the top portion 232 and the bottom portion 234 (when the top portion 232 is coupled to the bottom portion 234).

Figure 5:
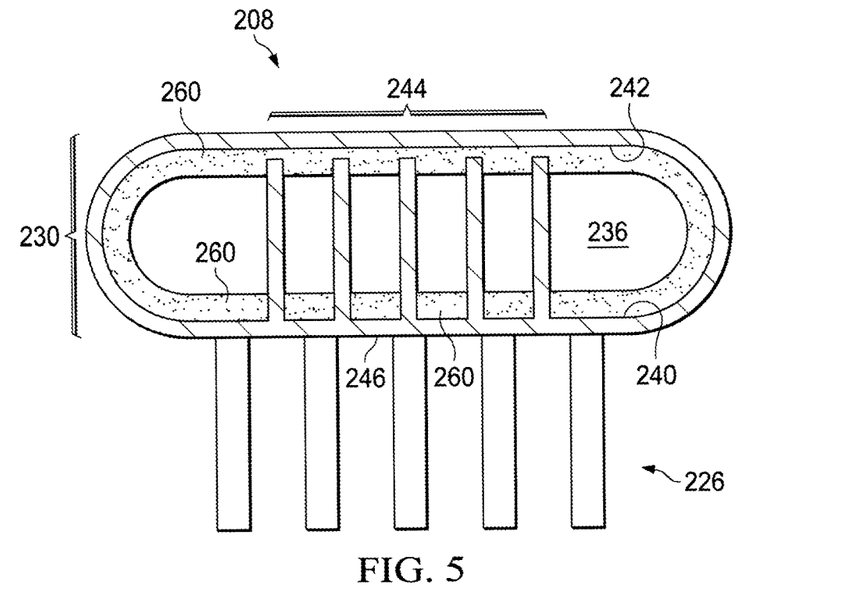
FIG. 5 illustrates a cross-sectional view of the heat transfer device.

FIG. 5 illustrates a cross-sectional view of the heat transfer device 208. The heat transfer device 208 can further include a wicking structure 260 (such as sintered powder, small grooves, mesh screen). The wicking structure 260 can be positioned along the first internal surface 240 and the second internal surface 242. Furthermore, in some examples, the wicking structure 260 can be positioned between adjacent internal fins 244 along the first internal surface 240. In some examples, the wicking structure 260 is between a subset of adjacent internal fins 244 along the first internal surface 240. Furthermore, in some examples, the wicking structure 260 can be positioned between adjacent internal fins 244 along the second internal surface 242. The wicking structure 260 can transport the working fluid as the condensed liquid from the second end 222 of the heat transfer device 208 to the first end 220 of the heat transfer device 208, as described with respect to FIG. 3.

Figure 6:
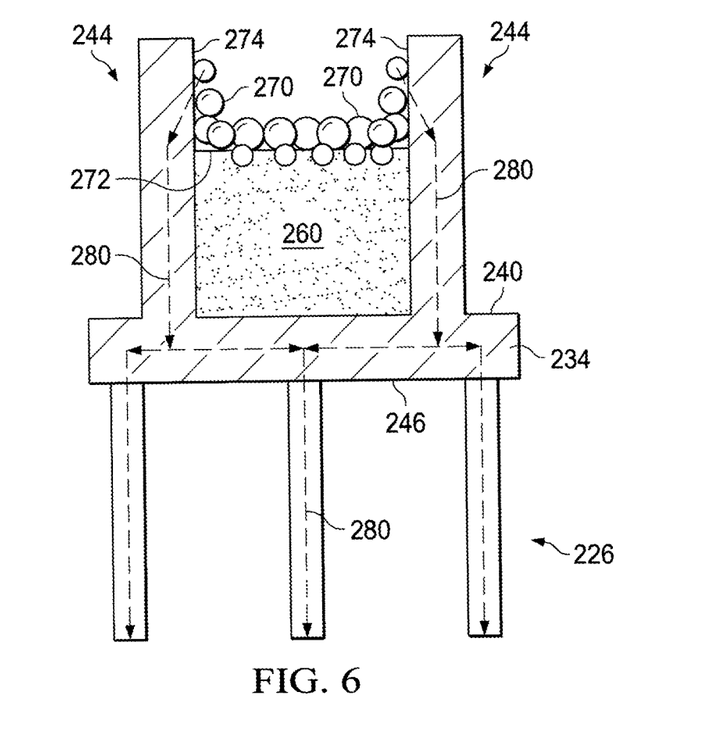
FIG. 6 illustrates a close-up cross-section view of a portion of the heat transfer device.

FIG. 6 illustrates a close-up cross-section view of a portion of the heat transfer device 208. To that end, the internal fins 244 are in thermal communication with the wicking structure 260. Furthermore, the RHE 226 is in thermal communication with the internal fins 244.

Specifically, vapor can condensate (condense) on/at the wicking structure 260, shown as condensation 270. For example, the condensation 270 can form on a surface 272 of the wicking structure 260. In some examples, the condensation that is accumulated on the wicking structure 260 can be absorbed as a liquid by the wicking structure 260. Additionally, the vapor can condensate on a surface 274 of the fins 244 that protrudes above the surface 272 of the wicking structure 260 (as condensation 270).

To that end, the internal fins 244 are configured to transfer heat from the internal chamber 236 (and from the thermal stack 214) to the RHE 226. Specifically, as vapor travels from the thermal stack 214 at the first end 220 of the heat transfer device 208 to the second end 222, the vapor can condense on the wicking structure 260 and/or the internal fins 244 (condensation 270). During such condensation, heat can be released (latent heat) that is conducted by the internal fins 244, through the bottom portion 234 (wall) including the first internal surface 240 and the external surface 246, to the RHE 226. In other words, thermal transfer can occur from the internal fins 244 to the RHE 226, shown along pathways 280.

In some examples, the wicking structure 260 can include a wire mesh or bundled wires that has a low-heat transfer capability.

In some examples, a subset or entirety of the internal fins 244 can be substantially straight fins, substantially circular (or oval), or pin fins, or a combination thereof.

In some examples, the heat transfer device 208 can include an additional set of internal fins that extend from the first internal surface 240 and towards the second internal surface 242. The additional set of internal fins can be positioned at the first end 220 of the sealed container 230. In some examples, the additional set of internal fins are soldered to the bottom portion 234, and formed from copper, or a copper-based material. The additional set of internal fins can include any number of fins, e.g., 3 fins, 10 fins, 20 fins, etc.

In some implementations, the internal fins 244 can be formed within the bottom portion 234, and in particular, within the first internal surface 240. That is, portions of the bottom portion 234 can be removed within the first internal surface 240 (e.g., recesses) to form the internal fins 244 (e.g., protrusions)

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A heat transfer device, including:
    a sealed container defining an internal chamber having a first internal surface positioned opposite to a second internal surface, the sealed container including a first end and a second end positioned opposite to the first end;
    a set of internal fins extending from the first internal surface of the internal chamber towards the second internal surface of the internal chamber, the set of internal fins positioned at the second end of the sealed container, the set of internal fins each having a first end positioned opposite to a second end;
    a wicking structure positioned along the first and the second internal surfaces, and i) positioned between adjacent fins of the set of fins along the first internal surface and at the first end of the fins and ii) positioned between the adjacent fins of the set of fins along the second internal surface and at the second end of the fins such that the set of internal fins are in thermal communication with the wicking structure;
    a remote heat exchanger positioned along an external surface of the sealed container at the second end of the sealed container, the remote heat exchanger adjacent to the set of internal fins such that the remote heat exchanger is in thermal communication with the set of internal fins; and
    a plurality of pillars extending from the first internal surface of the internal chamber towards the second internal surface of the internal chamber, the plurality of pillars positioned at the first end of the sealed container, the plurality of pillars configured to provide structural support of the sealed container.

2. The heat transfer device of claim 1, wherein the set of internal fins are configured to transfer heat to the remote heat exchanger.

3. The heat transfer device of claim 1, wherein the set of internal fins substantially span a distance of the remote heat exchanger.

4. The heat transfer device of claim 1, wherein the set of internal fins span approximately half of a distance of the remote heat exchanger.

5. The heat transfer device of claim 1, wherein the set of internal fins are substantially parallel to fins of the remote heat exchanger.

6. The heat transfer device of claim 1, wherein the set of internal fins are substantially perpendicular to fins of the remote heat exchanger.

7. The heat transfer device of claim 1, wherein the set of internal fins are at an angle with respect to fins of the remote heat exchanger.

8. The heat transfer device of claim 1, further comprising:
    an additional set of internal fins extending from the first internal surface of the internal chamber towards the second internal surface of the internal chamber, the additional set of internal fins positioned at the first end of the sealed container.

9. An information handling system, comprising:
    a processor;
    memory media storing instructions executable by the processor to perform operations;
    a heat transfer device, including:
        a sealed container defining an internal chamber having a first internal surface positioned opposite to a second internal surface, the sealed container including a first end and a second end positioned opposite to the first end, the set of internal fins each having a first end positioned opposite to a second end;
        a set of internal fins extending from the first internal surface of the internal chamber towards the second internal surface of the internal chamber, the set of internal fins positioned at the second end of the sealed container;
        a wicking structure positioned along the first and the second internal surfaces, and i) positioned between adjacent fins of the set of fins along the first internal surface and at the first end of the fins and ii) positioned between the adjacent fins of the set of fins along the second internal surface and at the second end of the fins such that the set of internal fins are in thermal communication with the wicking structure; and
        a remote heat exchanger positioned along an external surface of the sealed container at the second end of the sealed container, the remote heat exchanger adjacent to the set of internal fins such that the remote heat exchanger is in thermal communication with the set of internal fins; and
        a plurality of pillars extending from the first internal surface of the internal chamber towards the second internal surface of the internal chamber, the plurality of pillars positioned at the first end of the sealed container, the plurality of pillars configured to provide structural support of the sealed container.

10. The information handling system of claim 9, wherein the set of internal fins are configured to transfer heat to the remote heat exchanger.

11. The information handling system of claim 9, wherein the set of internal fins substantially span a distance of the remote heat exchanger.

12. The information handling system of claim 9, wherein the set of internal fins span approximately half of a distance of the remote heat exchanger.

13. The information handling system of claim 9, wherein the set of internal fins are substantially parallel to fins of the remote heat exchanger.

14. The information handling system of claim 9, wherein the set of internal fins are substantially perpendicular to fins of the remote heat exchanger.

15. The information handling system of claim 9, wherein the set of internal fins are at an angle with respect to fins of the remote heat exchanger.

16. The information handling system of claim 9, wherein the heat transfer device further comprises:
an additional set of internal fins extending from the first internal surface of the internal chamber towards the second internal surface of the internal chamber, the additional set of internal fins positioned at the first end of the sealed container.

* * * * *